United States Patent
Ito et al.

(10) Patent No.: US 8,026,460 B2
(45) Date of Patent: Sep. 27, 2011

(54) CONTROL CIRCUIT FOR THERMOSTATIC OVEN IN OVEN CONTROLLED CRYSTAL OSCILLATOR

(75) Inventors: Manabu Ito, Sayama (JP); Takeshi Uchida, Sayama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 500 days.

(21) Appl. No.: 12/219,304

(22) Filed: Jul. 18, 2008

(65) Prior Publication Data
US 2009/0020517 A1    Jan. 22, 2009

(30) Foreign Application Priority Data
Jul. 20, 2007   (JP) ................ P2007-189210

(51) Int. Cl.
*H05B 1/00* (2006.01)
*H03B 1/00* (2006.01)

(52) U.S. Cl. ............ 219/210; 331/69; 331/70; 331/158; 331/176; 310/341; 310/343; 310/344

(58) Field of Classification Search ............ 219/210; 331/69, 70, 158, 176; 310/341, 343, 344
See application file for complete search history.

(56) References Cited

U.S. PATENT DOCUMENTS

| | | | |
|---|---|---|---|
| 6,147,565 A * | 11/2000 | Satoh et al. | 331/70 |
| 6,166,608 A | 12/2000 | Merriss et al. | |
| 2003/0197567 A1 * | 10/2003 | Villella | 331/158 |
| 2006/0267702 A1 | 11/2006 | Neumann | |

FOREIGN PATENT DOCUMENTS

| | | |
|---|---|---|
| EP | 1 710 906 | 10/2006 |
| JP | S64-7320 | 1/1989 |
| JP | 03-126303 | 5/1991 |

OTHER PUBLICATIONS

European Search Report dated Nov. 19, 2008.

* cited by examiner

*Primary Examiner* — Shawntina Fuqua
(74) *Attorney, Agent, or Firm* — Jacobson Holman PLLC

(57) ABSTRACT

Provided is a control circuit for a thermostatic oven in an oven controlled crystal oscillator, which is capable of further improving stability of an oscillation frequency. A control circuit in which a thermistor whose resistance value changes according to a temperature outputs a signal according to the ambient temperature of the thermostatic oven inside the oscillator, an operational amplifier outputs a signal according to a difference between the output of the thermistor and a reference signal, a power transistor amplifies the output of the operational amplifier, and a heater generates heat based on a collector voltage of the power transistor, is provided with a temperature sensor circuit having a transistor with a base to which the output of the operational amplifier is input. The control circuit outputs a collector voltage of the transistor as an internal temperature signal which changes according to a temperature inside the oscillator.

8 Claims, 2 Drawing Sheets

CONTROL CIRCUIT FOR THERMOSTATIC OVEN IN OVEN CONTROLLED CRYSTAL OSCILLATOR

BACKGROUND OF THE INVENTION

1. Field of the Invention

The present invention relates to a control circuit for a thermostatic oven in an oven controlled crystal oscillator, and more particularly to a control circuit capable of further improving stability of the oscillation frequency of an oven controlled crystal oscillator by performing temperature-based compensation for the oscillation frequency with high accuracy.

2. Description of the Related Art

An oven controlled crystal oscillator (OCXO) has a crystal resonator disposed inside a case whose temperature is maintained constant, and has a stable frequency characteristic which is not easily influenced by an environmental temperature.

A control circuit for a thermostatic oven to be used in an oven controlled crystal oscillator has a heater which heats the thermostatic oven, and a thermistor whose resistance value changes according to the temperature, and controls the temperature in the thermostatic oven to be constant by adjusting a voltage to be applied to the heater according to the ambient temperature of the thermostatic oven.

To perform temperature-based compensation for the oscillation frequency of a crystal oscillator, the voltage is adjusted based on a temperature detected by a temperature sensor provided outside the oscillator to compensate for the oscillation frequency thereof.

Related arts relating to an oven controlled crystal oscillator are disclosed in Japanese Utility Model Application Laid-Open No. S64-7320 (Patent Document 1) and Japanese Patent Application Laid-Open No. H3-126303 (Patent Document 2).

The Patent Document 1 describes a thermostatic oven temperature control circuit which is configured to have a nichrome wire heater as a heating element provided in a temperature setting bridge and set the temperature according to a change in the resistance value of the heating element, and eliminates the need for a temperature sensor such as a thermistor.

The Patent Document 2 describes a temperature compensated crystal oscillator in which a transistor serving as an oscillation active element is used as a temperature sensor and a frequency control element, and which has a circuit configuration to facilitate integration.

Patent Document 1: Japanese Utility Model Application Laid-Open No. S64-7320

Patent Document 2: Japanese Patent Application Laid-Open No. H3-126303

Because the conventional crystal oscillator compensates for the oscillation frequency based on a temperature detected by the temperature sensor provided outside the oscillator, however, the temperature to be detected slightly differs from the temperature inside the oscillator where the crystal resonator is actually disposed, disabling more accurate temperature compensation.

In the conventional oven controlled crystal oscillator, the thermistor is used only for controlling the temperature of the thermostatic oven, and a signal according to the ambient temperature of the thermostatic oven which is to be detected by the thermistor is not used in control or the like of the oscillation frequency.

Further, the stability of the frequency of the conventional oven controlled crystal oscillator is $10^{-9}$ to $10^{-10}$ or so, and is not sufficient in a case of demanding a higher stability.

SUMMARY OF THE INVENTION

The present invention has been made in view of the foregoing situations, and it is an object of the invention to provide a control circuit for a thermostatic oven in an oven controlled crystal oscillator, which is capable of further improving stability of the oscillation frequency thereof.

The Patent Documents 1 and 2 have no description on a control circuit which performs temperature control of a thermostatic oven provided in an oscillator, produces a signal based on the ambient temperature of the thermostatic oven, and uses the signal in control or the like of the oscillation frequency.

To overcome the problems of the related arts, according to one aspect of the invention, there is provided a control circuit which is provided in contact with a thermostatic oven in an oven controlled crystal oscillator to control the thermostatic oven, and includes a heater having one end supplied with a supply voltage to generate heat, a regulator that stabilizes the supply voltage, a thermistor having one end supplied with the supply voltage via the regulator, and an other end from which a voltage according to a temperature is output with a resistance value being variable according to the temperature, an operational amplifier having one input terminal to which a divided voltage of the voltage according to the temperature at the other end of the thermistor is input, an other input terminal to which a reference voltage is input, and an output fed back to the one input terminal to amplify a difference between the reference voltage at the other input terminal and the voltage at the one input terminal, a power transistor that has a collector connected with an other end of the heater, a base to which the output of the operational amplifier is input, and an emitter grounded, and controls the generated heat of the heater, and an internal temperature detection circuit that amplifies a voltage according to an ambient temperature of the thermostatic oven inside the crystal oscillator, and outputs the amplified voltage. It is possible to output a signal indicative of the temperature inside the crystal oscillator having a crystal resonator disposed therein, and perform temperature compensation based on the signal, thereby making the oscillation frequency of the oven controlled crystal oscillator more stable.

According to the present invention, the control circuit may be configured such that the internal temperature detection circuit includes a transistor that has a collector supplied with the supply voltage via the regulator, a base to which the voltage according to the ambient temperature of the thermostatic oven is input, and an emitter grounded, and amplifies the voltage according to the ambient temperature of the thermostatic oven, a resistor and a capacitor connected in parallel to the base of the transistor, and an output terminal which is provided at the collector of the transistor and from which the amplified voltage according to the ambient temperature of the thermostatic oven is output as a voltage corresponding to an internal temperature.

According to the present invention, the control circuit may be configured such that an output voltage of the operational amplifier is input to the base of the transistor.

According to the present invention, the control circuit may be configured such that the divided voltage at the other end of the thermistor is input to the base of the transistor.

According to the present invention, the control circuit may be configured such that a voltage on a collector side of the power transistor is input to the base of the transistor.

According to another aspect of the present invention, there is provided an oven controlled crystal oscillator provided with means that controls a frequency of an oscillator according to a voltage from the output terminal of the temperature sensor circuit in the above-described control circuit, thus making it possible to output a signal indicative of the temperature inside the crystal oscillator having a crystal resonator disposed therein, and perform temperature-based compensation for the oscillation frequency based on a temperature signal in the oscillator, thereby making the oscillation frequency more stable.

DESCRIPTION OF REFERENCE NUMERALS

10 . . . power supply terminal, 11 . . . regulator, 12 . . . thermistor, 13 . . . operational amplifier, 14 . . . power transistor, 15 . . . heater, 20 . . . temperature sensor circuit, 21 . . . transistor, 22 . . . temperature signal output terminal, R1, R2, R3 . . . resistor, C1 . . . capacitor.

DETAILED DESCRIPTION OF THE PREFERRED EMBODIMENT

[Outline of the Invention]

An embodiment of the present invention will now be described with reference to the accompanying drawings.

A control circuit for a thermostatic oven in an oven controlled crystal oscillator according to an embodiment of the present invention to control the thermostatic oven is provided with a temperature sensor circuit, can acquire a voltage which changes according to the ambient temperature of the thermostatic oven in the oscillator, as an internal temperature signal, and can output the internal temperature signal to the outside to be used in frequency control or the like. The control circuit can perform temperature compensation based on the temperature inside the oscillator to thereby make the oscillation frequency of the oven controlled crystal oscillator more stable.

Figure 1:
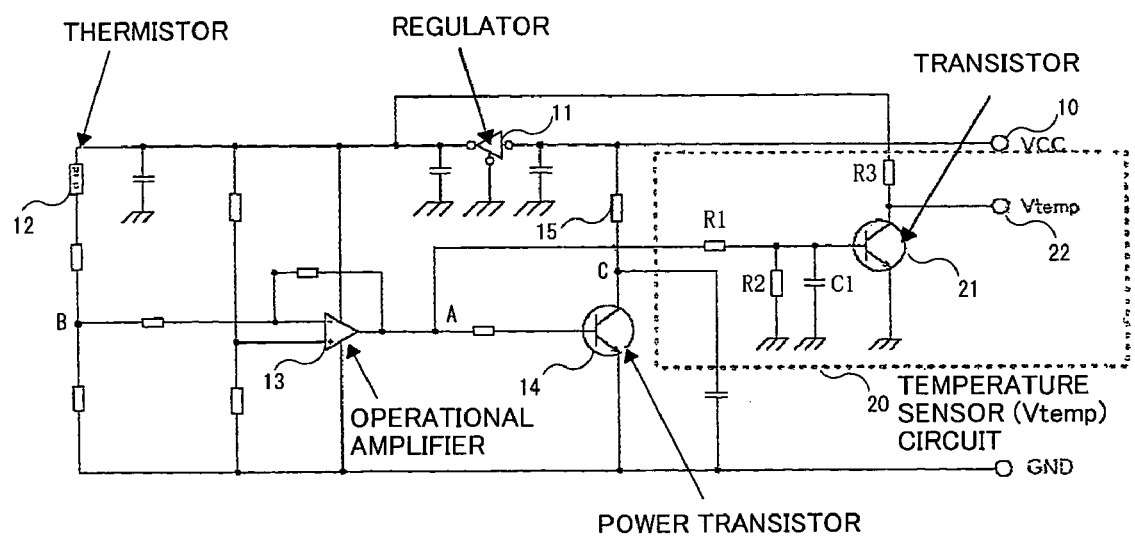
FIG. 1 is a circuit diagram of a control circuit for a thermostatic oven in an oven controlled crystal oscillator according to an embodiment of the invention (present control circuit).

[Oven Controlled Crystal Oscillator According to Embodiment: FIG. 1]

FIG. 1 is a circuit diagram of a control circuit for a thermostatic oven in an oven controlled crystal oscillator according to an embodiment of the invention (present control circuit).

As shown in FIG. 1, the present control circuit is provided in the oven controlled crystal oscillator, and is attached to a thermostatic oven to perform temperature control thereon. The present control circuit includes, as basic constituting parts, components, a power supply terminal (Vcc) 10, a regulator 11, a thermistor 12, an operational amplifier 13, a power transistor 14 and a heater 15, and has a temperature sensor circuit 20 which outputs an internal temperature signal, as the characterizing part of the control circuit.

The regulator 11 stabilizes a DC voltage from the power supply terminal 10.

The thermistor 12 is a temperature sensor whose resistance value changes according to the temperature, and is an NTC thermistor in the embodiment, which has a large resistance value when the temperature is low and a small resistance value when the temperature is high.

The operational amplifier 13 is a differential amplifier circuit that has one end to which a voltage from the thermistor 12 and a fed-back operational amplifier output are input, and the other end to which a reference voltage from the regulator 11 is input, and amplifies the difference between the voltages at two ends.

The power transistor 14 has a base to which the output of the operational amplifier 13 is input, and a collector connected with the heater 15 and the temperature sensor circuit 20 to which a voltage according to a base voltage is supplied.

The heater 15 generates heat according to the supplied voltage.

The temperature sensor circuit 20 amplifies the supplied voltage and outputs the amplified voltage as an internal temperature signal. The temperature sensor circuit 20 is equivalent to an internal temperature detection circuit recited in the appended claims.

Further, the temperature sensor circuit 20 which characterizes the present control circuit includes a transistor 21, resistors R1, R2, R3, a capacitor C1, and a temperature signal output terminal 22.

The transistor 21 has a base to which the output of the operational amplifier 13 is input, acquires a collector voltage according to the base voltage, and outputs the collector voltage as an internal temperature signal. That is, the transistor 21 amplifies a signal according to the ambient temperature of the thermostatic oven.

The resistor R1 is connected between a terminal A or the output of the operational amplifier 13 and the base of the transistor 21. Each of the resistor R2 and the capacitor C1 has one end connected to a node between the resistor R1 and the base of the transistor 21, and the other end grounded.

The resistor R3 has one end connected to the collector of the transistor 21 and the other end connected to a node between the regulator 11 and the thermistor 12.

An internal temperature signal (Vtemp) or a voltage according to the ambient temperature of the thermostatic oven in the crystal oscillator is output from the temperature signal output terminal 22.

[Performance of Present Control Circuit]

The performance of the present control circuit will be described.

In the present control circuit, a supply voltage stabilized by the regulator 11 is input to one input terminal of the operational amplifier 13 via the thermistor 12 and a resistor. The voltage input to the operational amplifier 13 is the supply voltage divided and becomes a reference voltage.

The feedback output of the operational amplifier 13 added to the output of the thermistor 12 is input to the other input terminal of the operational amplifier 13, so that a signal according to the difference between the voltages respectively input to the two input terminals becomes the output of the operational amplifier 13.

The output of the operational amplifier 13 is input to the base of the power transistor 14 and the temperature sensor circuit 20.

The heater 15 generates heat according to the collector current of the power transistor 14, and the temperature sensor circuit 20 outputs an internal temperature signal according to the output of the operational amplifier 13.

The performance of the heater 15 will be described specifically.

Specifically, when the ambient temperature of the thermostatic oven is low, the resistance value of the thermistor 12 is large, so that the output voltage of the thermistor 12 becomes lower, thus increasing the difference between the output voltage and the reference voltage from the regulator 11. Accordingly, the output current of the operational amplifier 13 increases, increasing the collector current of the power transistor 14. This increases the current flowing across the heater 15, increasing the amount of heat generated. When the temperature is low, therefore, the amount of heat generated by the heater 15 increases, thus rapidly heating the thermostatic oven.

When the ambient temperature of the thermostatic oven becomes higher, the resistance value of the thermistor 12 becomes smaller. This increases the output of the thermistor 12, making the difference between the output of the thermistor 12 and the reference voltage smaller. This decreases the output of the operational amplifier 13 decreases and the collector current of the power supply terminal 10, thus making the amount of heat generated by the heater 15 smaller. The present control circuit performs temperature control on the thermostatic oven this way.

That is, the output (terminal B) of the thermistor 12, the output (terminal A) of the operational amplifier 13, and the collector current (voltage) (terminal C) of the power supply terminal 10 are a signal corresponding to the ambient temperature of the thermostatic oven, and the signal is amplified to a voltage suitable for frequency control by the temperature sensor circuit 20 and is then output.

[Performance of Temperature Sensor Circuit]

The performance of the temperature sensor circuit 20 will be described later.

In the temperature sensor circuit 20, the output of the operational amplifier 13 is supplied to the base of the transistor 21 whose collector voltage is output from the temperature signal output terminal 22 as the internal temperature signal Vtemp according to the ambient temperature of the thermostatic oven in the crystal oscillator. The internal temperature signal can be adequately adjusted to a proper value according to the characteristic values of the resistors R1, R2, R3 and the capacitor C1.

While the input signal to the transistor 21 of the temperature sensor circuit 20 is the output of the operational amplifier 13 from the terminal A in this example, it may be the output of the thermistor 12 from the terminal B or may be the collector voltage of the power transistor 14 from the terminal C.

The internal temperature signal Vtemp acquired in this manner can be used in temperature compensation for the oscillation frequency of the oven controlled crystal oscillator.

For example, control means such as a varicap diode whose resistance value changes according to the voltage is provided, and the internal temperature signal is input to the varicap diode whose output is applied as a control voltage for the crystal resonator.

Accordingly, this configuration can perform temperature-based compensation for the oscillation frequency with higher accuracy than the normal oven controlled crystal oscillator.

[Example of Internal Temperature Signal]

Figure 2:
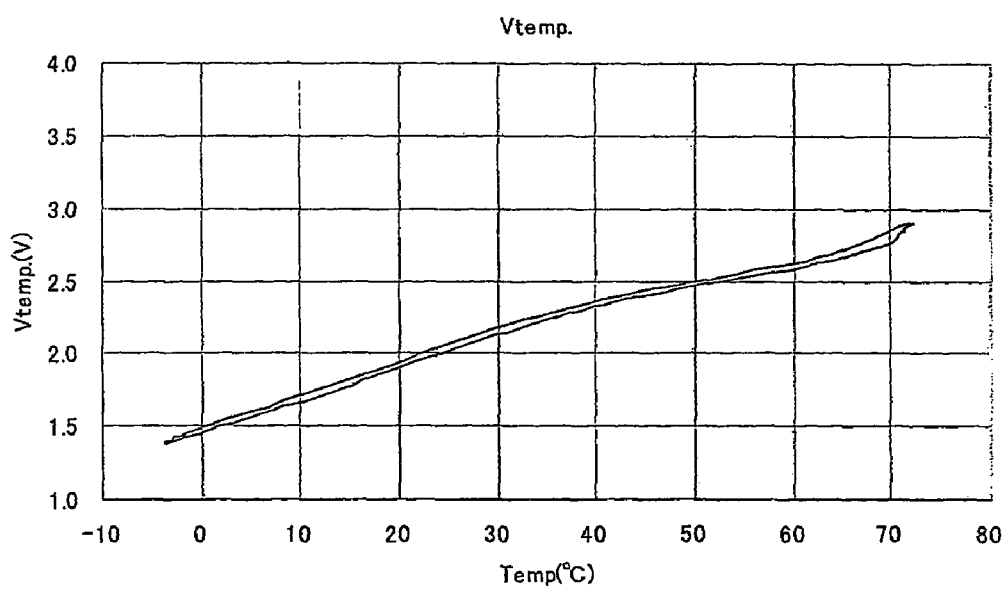
FIG. 2 is a characteristic diagram showing an example of an internal temperature signal output from a temperature sensor circuit 20.

Next, an example of the internal temperature signal will be described referring to FIG. 2. FIG. 2 is a characteristic diagram showing an example of the internal temperature signal output from the temperature sensor circuit 20.

The output characteristic of the internal temperature signal was measured twice with the ambient (outside) temperature of the crystal oscillator, the actual measurements as shown in FIG. 2 were acquired. The results show that the present control circuit would provide a stable internal temperature signal output in the practical temperature range.

[Advantages of Embodiment]

The control circuit for the thermostatic oven of an oven controlled crystal oscillator according to the present invention is configured in such a way that the thermistor 12 whose resistance value changes according to a temperature outputs a signal according to the ambient temperature of the thermostatic oven inside the crystal oscillator, the operational amplifier 13 outputs a signal according to the difference between the output of the thermistor 12 and the reference signal, the power transistor 14 changes the collector voltage according to the output of the operational amplifier 13, and the heater 15 generates heat based on the collector voltage of the power transistor 14, the temperature sensor circuit 20 having the transistor 21 to whose base the output of the operational amplifier 13 is input is provided, so that the control circuit outputs the collector voltage of the transistor 21 as an internal temperature signal which changes according to the temperature inside the oscillator. This brings about an advantage such that the internal temperature signal indicative of the temperature state in the oscillator can be used in temperature compensated control or the like on the oscillation frequency.

According to the present invention, the input to the temperature sensor circuit 20 may be the output voltage of the thermistor 12 or the collector voltage of the power transistor 14, bringing about an advantage such that the degree of freedom of circuit design can be increased.

The present invention is suitable for a control circuit which can further improve stability of the oscillation frequency of the oven controlled crystal oscillator by performing temperature-based compensation for the oscillation frequency with high accuracy.

What is claimed is:

1. A control circuit provided in contact with a thermostatic oven in an oven controlled crystal oscillator to control the thermostatic oven, the control circuit comprising:

a heater having one end supplied with a supply voltage to generate heat;

a regulator that stabilizes the supply voltage;

a thermistor having one end supplied with the supply voltage via the regulator, and an other end from which a voltage according to a temperature is output with a resistance value being variable according to the temperature;

an operational amplifier having one input terminal to which a divided voltage of the voltage according to the temperature at the other end of the thermistor is input, an other input terminal to which a reference voltage is input, and an output fed back to the one input terminal to amplify a difference between the reference voltage at the other input terminal and the voltage at the one input terminal;

a power transistor that has a collector connected with an other end of the heater, a base to which the output of the operational amplifier is input, and an emitter grounded, and controls the generated heat of the heater; and an internal temperature detection circuit that amplifies a voltage according to an ambient temperature of the thermostatic oven inside the crystal oscillator, and outputs the amplified voltage;

wherein the internal temperature detection circuit includes:

a transistor that has a collector supplied with the supply voltage via the regulator, a base to which the voltage according to the ambient temperature of the thermostatic oven is input, and an emitter grounded, and amplifies the voltage according to the ambient temperature of the thermostatic oven;

a resistor and a capacitor connected in parallel to the base of the transistor; and an output terminal which is provided at the collector of the transistor and from which the amplified voltage according to the ambient temperature of the thermostatic oven is output as a voltage corresponding to an internal temperature.

2. The control circuit according to claim 1, wherein an output voltage of the operational amplifier is input to the base of the transistor.

3. The control circuit according to claim 1, wherein the divided voltage at the other end of the thermistor is input to the base of the transistor.

4. The control circuit according to claim 1, wherein a voltage on a collector side of the power transistor is input to the base of the transistor.

5. An oven controlled crystal oscillator provided with means that controls a frequency of an oscillator according to a voltage from the output terminal of the temperature sensor circuit in the control circuit as set forth in claim 1.

6. An oven controlled crystal oscillator provided with means that controls a frequency of an oscillator according to a voltage from the output terminal of controls a frequency of an oscillator according to a voltage from the output terminal of the temperature sensor circuit in the control circuit as set forth in claim 2.

7. An oven controlled crystal oscillator provided with means that controls a frequency of an oscillator according to a voltage from the output terminal of the temperature sensor circuit in the control circuit as set forth in claim 3.

8. An oven controlled crystal oscillator provided with means that controls a frequency of an oscillator according to a voltage from the output terminal of the temperature sensor circuit in the control circuit as set forth in claim 4.

* * * * *

UNITED STATES PATENT AND TRADEMARK OFFICE
CERTIFICATE OF CORRECTION

| | | |
|---|---|---|
| PATENT NO. | : 8,026,460 B2 | Page 1 of 1 |
| APPLICATION NO. | : 12/219304 | |
| DATED | : September 27, 2011 | |
| INVENTOR(S) | : Ito et al. | |

It is certified that error appears in the above-identified patent and that said Letters Patent is hereby corrected as shown below:

Column 8, lines 3-4, delete "of controls a frequency of an oscillator according to a voltage from the output terminal".

Signed and Sealed this
Twentieth Day of December, 2011

David J. Kappos
*Director of the United States Patent and Trademark Office*